(12) United States Patent
Iacoponi

(10) Patent No.: US 6,218,078 B1
(45) Date of Patent: *Apr. 17, 2001

(54) CREATION OF AN ETCH HARDMASK BY SPIN-ON TECHNIQUE

(75) Inventor: John A. Iacoponi, San Jose, CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/936,276

(22) Filed: Sep. 24, 1997

(51) Int. Cl.[7] .............................. G03F 7/00; C03C 15/00
(52) U.S. Cl. ............................ 430/313; 430/317; 216/41
(58) Field of Search ................................. 430/313, 317; 216/41

(56) References Cited

U.S. PATENT DOCUMENTS

| 4,532,002 | * | 7/1985 | White | 156/643 |
|---|---|---|---|---|
| 5,219,788 | | 6/1993 | Abernathey et al. | 437/187 |
| 5,291,019 | * | 3/1994 | Powell | 250/338.4 |
| 5,371,047 | * | 12/1994 | Greco | 437/238 |
| 5,601,902 | * | 2/1997 | Hammerschmidt | 428/209 |
| 5,667,922 | * | 9/1997 | Martiska | 430/9 |
| 5,688,717 | | 11/1997 | Shen et al. | 437/190 |
| 5,691,116 | * | 11/1997 | Revelli | 430/321 |
| 5,821,169 | * | 10/1998 | Nguyen | 438/736 |
| 5,827,436 | | 10/1998 | Kamide et al. | 216/77 |
| 5,854,126 | * | 12/1998 | Tobben | 438/626 |
| 5,858,869 | * | 1/1999 | Chen | 438/597 |
| 5,858,879 | | 1/1999 | Chao et al. | 438/725 |
| 5,866,448 | * | 2/1999 | Pradeep | 438/231 |
| 5,866,945 | * | 2/1999 | Chen | 257/750 |
| 5,924,005 | * | 7/1999 | Waldo | 438/623 |
| 5,981,398 | * | 11/1999 | Tsai | 438/710 |
| 5,989,983 | * | 11/1999 | Goo | 438/473 |
| 6,121,150 | * | 9/2000 | Avanzino | 438/692 |

* cited by examiner

Primary Examiner—Mark F. Huff
Assistant Examiner—Nicole Barreca
(74) Attorney, Agent, or Firm—Sawyer Law Group LLP

(57) ABSTRACT

A system and method for etching structures in a layer of a semiconductor device are disclosed. The method and system include spinning-on a hardmask layer, patterning the hardmask layer, and etching the layer. The hardmask layer is disposed above the layer and has a high etch selectivity.

6 Claims, 2 Drawing Sheets

CREATION OF AN ETCH HARDMASK BY SPIN-ON TECHNIQUE

FIELD OF THE INVENTION

The present invention relates to a semiconductor processing and more particularly to a method and system for creating an etch hardmask using a spin-on technique.

BACKGROUND OF THE INVENTION

Low dielectric constant materials are of increasing interest for providing a dielectric layer in semiconductor processing. Certain low dielectric materials, for example certain polymers or other organic materials, behave similarly to photoresist materials when etched. As a result, etching structures such as trenches and vias into these materials is difficult using conventional photolithographic techniques. For example, a large thickness of photoresist may be required to etch a trench or via. Such a thick layer of photoresist makes photolithography difficult, particularly when using shorter wavelength light to pattern the photoresist. In addition, when excess photoresist is removed, the underlying dielectric layer is attacked. Consequently, any structures etched into the dielectric will be affected by removal of the photoresist.

An etch hardmask is conventionally used to process such materials. The hardmask is etched at a much lower rate than the material contained in the underlying layer. The hardmask, therefore, allows the underlying layer to be processed without excessive thicknesses of photoresist. Typically, the etch hardmask is deposited using chemical vapor deposition ("CVD"). Once the hardmask is deposited and patterned, the underlying layer can be etched. Although CVD allows deposition of the hardmask, the CVD apparatus is relatively complex, expensive, and has throughput limitations. In addition, the CVD process requires relatively high temperatures, which may damage the underlying layer. Finally, the materials used to form a hardmask using CVD are subject to stresses which may lead to failures in the semiconductor device when the temperature is decreased.

Accordingly, what is needed is a system and method for easily, inexpensively, and rapidly providing an etch hardmask. The present invention addresses such a need.

SUMMARY OF THE INVENTION

The present invention provides a method and system for etching structures in a layer of a semiconductor device. The method and system comprise spinning-on a hardmask layer, patterning the hardmask layer, and etching the layer. The hardmask layer is disposed above the layer and has a high etch selectivity.

According to the system and method disclosed herein, the present invention provides a simpler, cheaper, and higher throughput method for providing an etch hardmask, thereby increasing overall system performance.

DETAILED DESCRIPTION OF THE INVENTION

Figure 1:
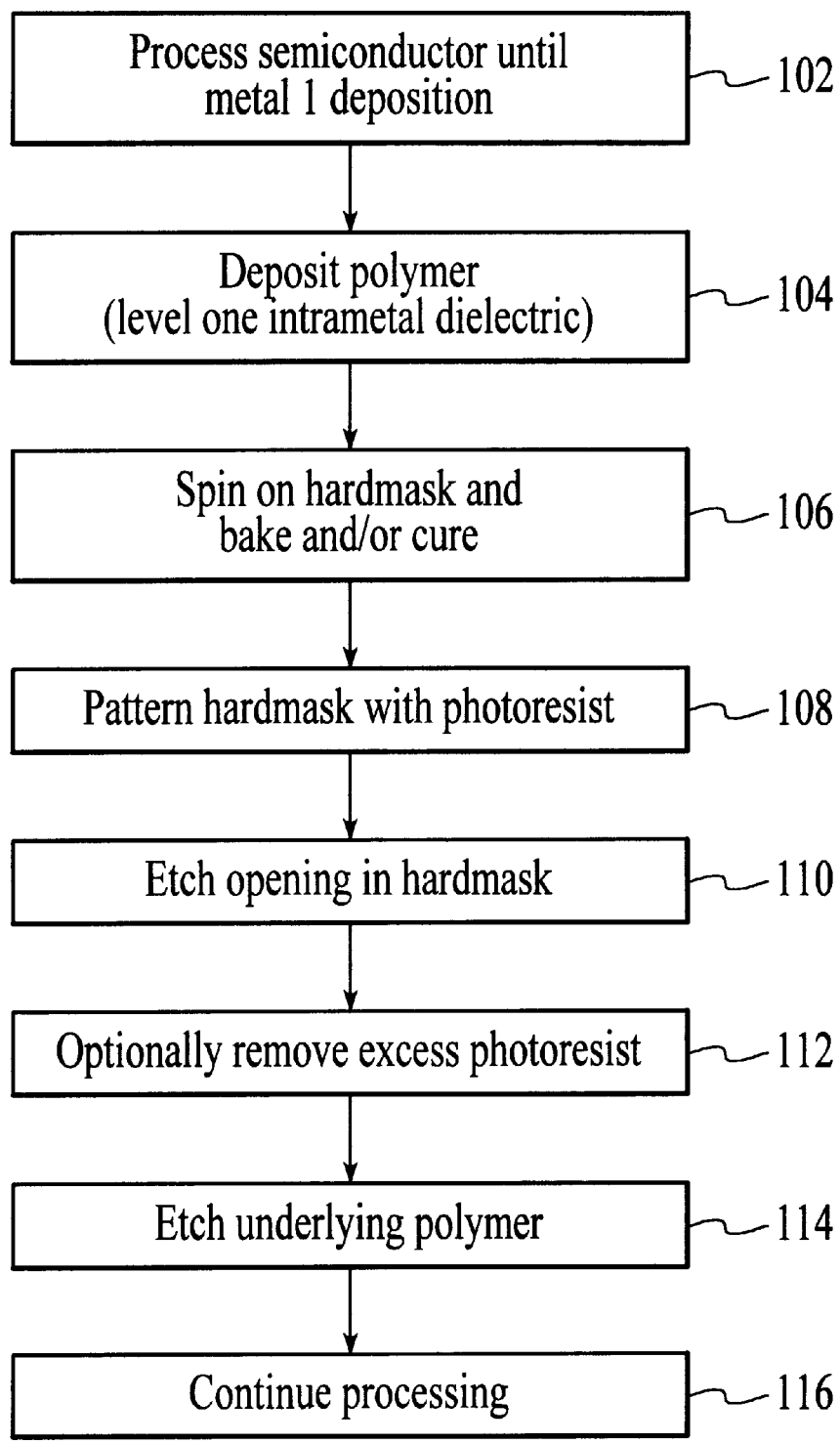
FIG. 1 is a flow chart depicting a method for etching materials requiring a hardmask in accordance with the method and system.

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Increasingly, low dielectric constant materials are of interest for providing dielectric layers in semiconductor devices. Some of these materials, such as benzocyclobutene ("BCB") or other organic materials, behave similarly to photoresist. Thus, the etch selectivity of the photoresist for such materials is close to one. As used herein, etch selectivity of a material is the ratio of etching of photoresist to the etching of the material. As a result, etching a one micrometer trench in the low dielectric constant material requires one micrometer of photoresist around the trench. Thus, a large thickness of photoresist is required to etch a trench or via. This makes photolithography difficult, especially at deep ultraviolet wavelengths. After etching, the remaining photoresist is removed using oxygen plasma or solvents. The oxygen plasma and solvent typically attack the underlying low dielectric constant material. Consequently, any structures present in the underlying layer will be further etched when the photoresist is removed.

In order to process such low dielectric constant or organic materials, an etch hardmask is conventionally used. The etch selectivity of the hardmask is typically greater than one. The hardmask is, therefore, etched at a much lower rate than the low dielectric constant material. The layer of etch hardmask be used can be made significantly thinner than photoresist would be. Typically, the etch hardmask is deposited using chemical vapor deposition ("CVD").

Hardmasks deposited using CVD are typically composed of silicon dioxide ($SiO_2$) or silicon nitride ($Si_xN_y$). In order to deposit the hardmask, the semiconductor device being processed is placed in a separate, high vacuum CVD system. Once the CVD deposition is complete, the semiconductor device can be removed from the CVD system, the hardmask can be patterned and processing of the semiconductor device can be completed.

Although a conventional CVD system is capable of providing a hardmask for etching of materials such as BCB which behave like photoresist or require relatively thick layers of photoresist for processing, those with ordinary skill in the art will realize that the CVD process is relatively complex. A separate CVD apparatus must be used to provide the hardmask. This apparatus is a large capital expenditure, is relatively complex, and requires continued maintenance. Thus, the additional cost of purchasing and maintaining the CVD apparatus will have to be borne when processing semiconductors using the conventional method. A conventional CVD system also has a limited throughput, increasing the time required to output a large quantity of semiconductor devices. Moreover, one of ordinary skill in the art will realize that conventional materials used for a CVD deposited hardmask are subject to large stresses as the temperature lowers. These stresses can contribute to delamination of the hardmask and subsequent failure of the semiconductor device. During deposition of the hardmask using CVD, the layer onto which the hardmask is being deposited undergoes a significant increase in temperature, typically up to 400–450 degrees centigrade, limiting the materials for which a hardmask can be used. Finally, the complexity of the CVD process complicates the processing of the semiconductor device.

The present invention provides for a method and system for providing a hardmask more inexpensively, more simply and with a higher throughput. The present invention may also reduce the temperatures required for forming the hardmask. The present invention will be described in terms of a spin-on method for providing a hardmask for processing a particular dielectric layer in a semiconductor device. However, one of ordinary skill in the art will readily recognize that this method and system will operate effectively for other layers made of other materials, including metals, and other hardmask materials.

The method and system comprise providing a spin-on hardmask. Because the hardmask is spun onto the semiconductor device, consequently, a separate CVD apparatus is unnecessary. Instead, the same apparatus can be used for providing the hardmask as for providing a spun-on dielectric layer. In addition, the hardmask can be deposited in the desired thickness. Consequently, problems due to thick photoresist are reduced. The hardmask need not be removed, thereby aiding in the preservation of structures etched into the underlying layer. As a result, the throughput for a system providing the hardmask can be increased while the cost of providing the hardmask decreases.

To more particularly illustrate the method and system in accordance with the present invention, refer now to FIGS. 1 and 2A through 2D. FIG. 1 depicts a flow chart of one embodiment of a method 100 for providing a hardmask in accordance with the present invention. FIGS. 2A through 2D depicting a semiconductor device during processing in accordance with the method 100. First, the semiconductor device is processed until it is ready for deposition of the low dielectric constant material or other material for which a hardmask is to be used, via step 102. In a preferred embodiment, the semiconductor is processed until, but not including, the first layer of metal. However, the method 100 and system may be used for providing a hardmask for another layer in the semiconductor device.

Figure 2A:
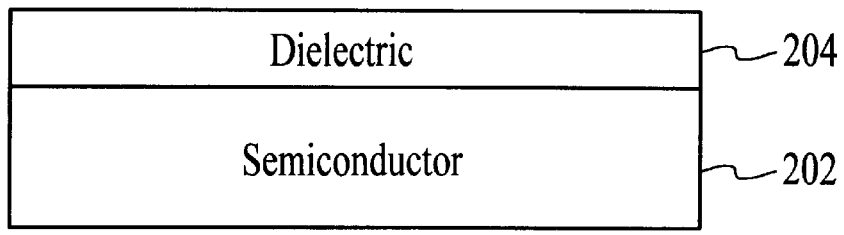
FIGS. 2A–D are block diagrams of a semiconductor during processing of a material requiring a hardmask in accordance with the method and system.

Next, the layer to be etched is deposited via step 104. FIG. 2A depicts the semiconductor device 200 after step 104, having the processed semiconductor 202 and a layer 204 to be etched. In a preferred embodiment, the layer 204 to be etched is a low dielectric constant material, such as BCB. Also in a preferred embodiment, the layer 204 is spun on. However, layer 204 could contain any material for which a hardmask is used and need not be spun on. Thus, the layer 204 need not be a dielectric layer.

Figure 2B:
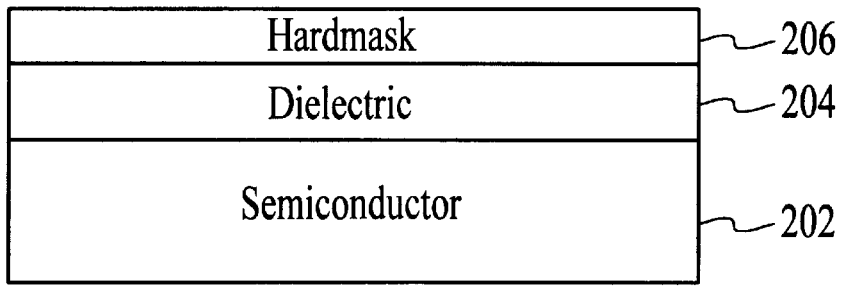

Once the layer 204 is provided, the hardmask is spun on and, if required, baked and cured via step 106. FIG. 2B depicts the semiconductor device 200 after the hardmask 206 is spun on. The hardmask contains a material having a etch selectivity greater than one. Thus, the hardmask 206 is etched at a lower rate than the layer 204. In a preferred embodiment, the thickness of the hardmask 206 is between one thousand and two thousand Angstroms. Also in a preferred embodiment, the hardmask is composed of hydrogen silsesquioxane ("HSQ"). However, nothing prevents the method and system from being used with another hardmask material.

Because the hardmask 206 is spun on rather than deposited using CVD, the hardmask 206 may be provided using the same apparatus as for providing the low dielectric constant layer 204. A separate, expensive, relatively high-maintenance apparatus for depositing the hardmask 206 is not required. In addition, the process for providing the hardmask is simplified. As a result, the throughput of the process 100 is increased, the cost of the process 100 is decreased, and the process is simplified.

Figure 2C:
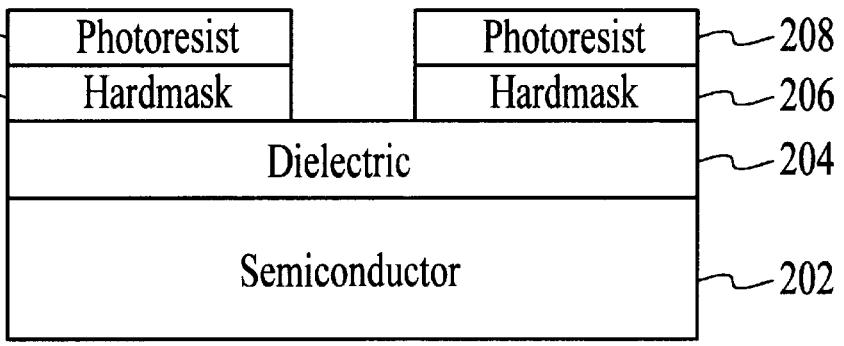

The hardmask is then patterned via step 108. In a preferred embodiment, step 108 includes depositing a coating of photoresist and patterning the photoresist using conventional photolithographic techniques. The hardmask is then etched via step 110. FIG. 2C depicts the semiconductor device 200 after the hardmask 206 is etched. Note that the layer of photoresist 208 can be much thinner than without the hardmask, because the etch selectivity of the hardmask is greater than one. In one embodiment, once the hardmask has been etched, the excess portion of the photoresist 208 may be removed via step 112. Removing the excess portion of the photoresist 208 prior to etching the dielectric layer 204 prevents the removal of the photoresist 208 from affecting structures to be etched into the dielectric layer 204. However, in another embodiment, the excess photoresist need not be removed.

Figure 2D:
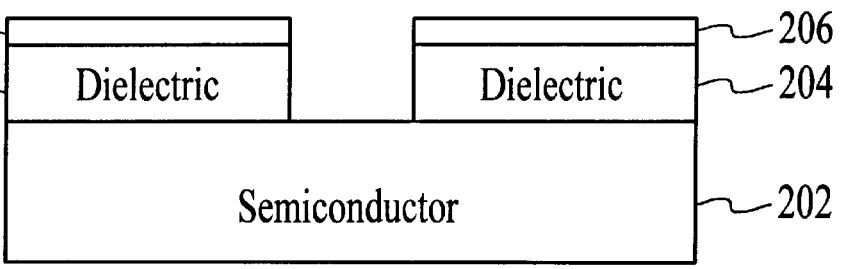

Once an opening in the hardmask has been provided in step 206, the underlying layer 204 is etched via step 116. FIG. 2D depicts the semiconductor device 200 after the layer 204 has been completely etched.

As mentioned above, the photoresist 208 need not be removed prior to etching the underlying layer 204. Instead, in one embodiment, the thicknesses of the hardmask 206 and the photoresist 208 depend on the thickness of the underlying layer 204. In such an embodiment, the combination of thicknesses of the hardmask 206 and the photoresist 208 are chosen such that when the layer 204 is completely etched, the photoresist 208 has been completely removed by the etch. Consequently, additional steps to remove the photoresist 208, which may also degrade the layer 204, need not be performed. Also in a preferred embodiment, the remaining layer of hardmask 206 is thin. This thin layer of hardmask 206 can be left in place without adversely affecting the performance of the layer 204 or the semiconductor device 200.

A method and system has been disclosed for providing a spin-on hardmask.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for etching structures in a low dielectric constant layer of a semiconductor device comprising the steps of:

spinning-on a hardmask layer of hydrogen silsesquioxane, the hardmask layer being disposed on the low dielectric constant layer and having a high etch selectivity, the low dielectric constant layer being a dielectric layer in the semiconductor device and comprising benzucyclobutene;

patterning the hardmask layer; and etching the low dielectric constant layer.

2. The method of claim 1 wherein the step of patterning the hardmask layer further comprises the steps of:

providing a photoresist layer;

patterning the photoresist layer; and etching the hardmask layer.

3. The method of claim 2 further comprising the step of:

removing an excess portion of the photoresist layer prior to etching the hardmask layer.

4. The method of claim 2 wherein the hardmask layer further includes a first thickness, and wherein the photoresist layer further includes a second thickness, the method further comprising the step of:

selecting the first thickness and the second thickness so that the photoresist layer is completely removed by the step of etching the low dielectric constant layer.

5. The method of claim 4 wherein a first thickness of the layer of hydrogen silsesquioxane is between approximately one thousand Angstroms and two thousand Angstroms.

6. The method of claim 5 further comprising the step of removing the hardmask layer.

* * * * *